United States Patent
Zory, Jr.

[11] Patent Number: 6,167,072
[45] Date of Patent: Dec. 26, 2000

[54] MODULATED CAP THIN P-CLAD SEMICONDUCTOR LASER

[75] Inventor: Peter S. Zory, Jr., Gainesville, Fla.

[73] Assignee: University of Florida, Gainesville, Fla.

[21] Appl. No.: 09/092,079

[22] Filed: Jun. 5, 1998

Related U.S. Application Data

[60] Provisional application No. 60/051,010, Jun. 6, 1997.

[51] Int. Cl.[7] .................................................. H01S 5/00
[52] U.S. Cl. ........................... 372/46; 372/46; 372/43; 372/69; 372/70; 372/72
[58] Field of Search ................................. 372/46, 43, 69, 372/70, 72

[56] References Cited

U.S. PATENT DOCUMENTS

| | | | |
|---|---|---|---|
| 4,727,557 | 2/1988 | Burnham et al. | 372/50 |
| 4,949,352 | 8/1990 | Plumb | 372/46 |
| 5,082,799 | 1/1992 | Holmstrom et al. | 437/129 |
| 5,499,260 | 3/1996 | Takahashi et al. | 372/46 |
| 5,504,768 | 4/1996 | Park et al. | 438/39 |
| 5,591,407 | 1/1997 | Groger et al. | 422/82.05 |
| 5,889,913 | 3/1999 | Tohyama et al. | 385/131 |

FOREIGN PATENT DOCUMENTS 63178576  7/1998  Japan .

OTHER PUBLICATIONS

A. Furuya and H. Tanaka, "Superposed multiquantum barrier for InGaAlP heterojunctions", IEEE Journal Of Quantum Electronics, vol. 28, No. 10, Oct. 1992, Pag. 1977–1982.

Macomber et al, *Proc. SPIE*, vol. 3001, pp. 42–54 (Feb. 1997).

Wu et al, *IEEE Photonics Tech. Lett.*, vol. 6, No. 12, pp. 1427–1429 (Dec. 1994).

Zory et al, *IEEE J. Quantum Electron.*, vol. QE–11, No. 7, pp. 451–457 (Jul. 1975).

Walpole et al, *Appl. Phys. Lett.*, vol. 30, No. 10, pp. 524–526 (May 15, 1977).

Macomber et al, *Appl. Phys. Lett.*, vol. 51, No. 7, pp. 472–474 (Aug. 17, 1987).

Shani et al, *IEEE J. Quantum Electron.*, vol. 24, No. 11, pp. 2135–2137 (Nov. 1988).

Rast et al, *IEEE Photonics Tech. Lett.*, vol. 7, No. 8, pp. 830–832 (Aug. 1995).

Smith et al, Proceedings of IEEE/LEOS Annual Meeting, San Francisco, CA, pp. 294–295 (1995).

Amann, *IEEE J. Quantum Electron.*, vol. QE–22, No. 10, pp. 1992–1998 (Oct. 1986).

Botez et al, *Appl. Phys. Lett.*, vol. 53, No. 6, pp. 464–466 (Aug. 8, 1988).

Botez et al, *IEEE J. Quantum Electron.*, vol. 26, No. 3, pp. 482–495 (Mar. 1990).

Wu et al, *IEEE Photonics Tech. Lett.*, vol. 7, No. 7, pp. 718–720 (Jul. 1995).

Miester et al, *Proc. SPIE*, vol. 3001, pp. 177–183 (Feb. 1997).

Grove et al, *J. Appl. Phys.*, vol. 76, No. 1, pp. 587–589 (Jul. 1, 1994).

Botez et al, *Appl. Phys. Lett.*, vol. 58, pp. 2070–2072 (1991).

Laughton et al, *Electronics Letters*, vol. 30, No. 4, pp. 303–304 (Feb. 17, 1994).

*Primary Examiner*—Frank G. Font
*Assistant Examiner*—Delma R. Flores Ruiz
*Attorney, Agent, or Firm*—Miles & Stockbridge; Dennis P. Clarke

[57] ABSTRACT

A semiconductor laser structure for use having a laser substructure so constructed and arranged to have an active region in close proximity to the top surface region and separated therefrom by a separation region, the separation region having a lower refractive index than the top surface region and the active region.

19 Claims, 9 Drawing Sheets

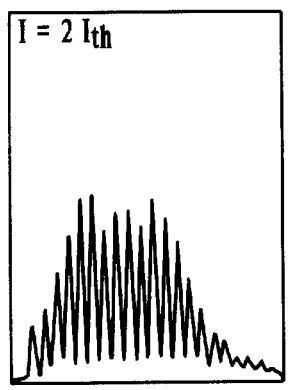
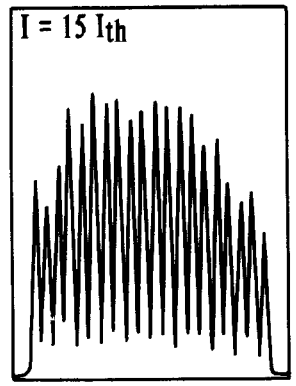
FIG. 14A  FIG. 14B
FIG. 15A  FIG. 15B
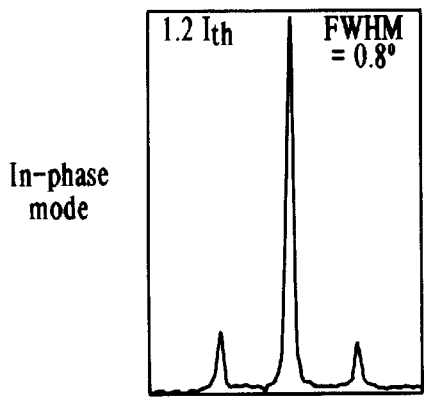
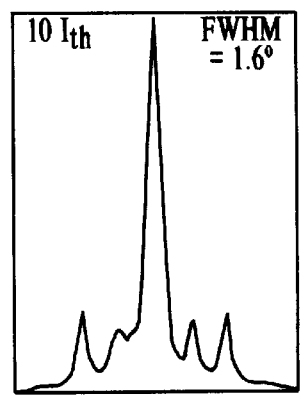
In-phase mode
Out-of-phase mode
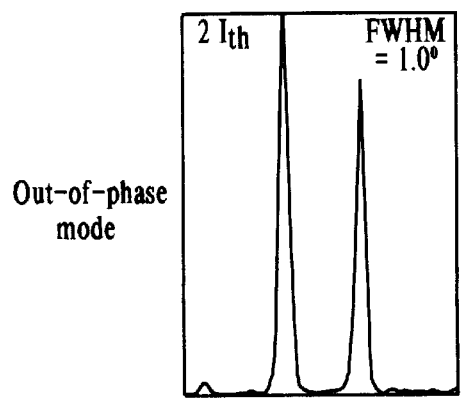
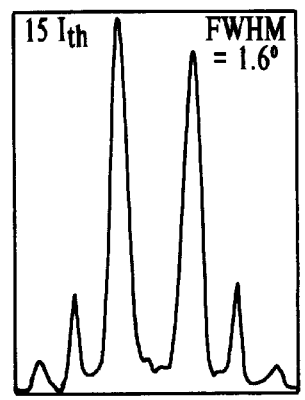
FIG. 15C  FIG. 15D

MODULATED CAP THIN P-CLAD SEMICONDUCTOR LASER

RELATED APPLICATION

Reference is hereby made to provisional patent application Ser. No. 60/051,010 filed Jun. 6, 1997, the benefit of the filing date of which is claimed herein.

Research leading to the reduction to practice of the present invention was supported in part by the U.S. Air Force via Grant No. F-29601-96-C-0141. The U.S. Government has certain rights in and to the invention described herein.

BACKGROUND OF THE INVENTION

1. Field of the Invention

The present invention relates to semiconductor laser structures.

2. Description of Related Art

In order to fabricate semiconductor lasers with superior performance characteristics, conventional designs require complex processing of the multi-layer laser material at the wafer level. Some of these complexities can be avoided by using a design in which the cladding layer closest to the wafer surface (usually the p-type cladding layer) is made much thinner than usual.

In these thin p-clad designs as well as in standard thick p-clad designs, the top layer of the laser material (cap layer) is usually heavily p-doped for ohmic contact purposes. In the thin p-clad designs, conventional wisdom dictates that the cap layer must be made very thin in order to avoid large optical loss.

Another critical step in the manufacture of semiconductor diode lasers is the growth of epitaxial material on top of the processed material. The probability for material loss during this "regrowth" process is high, leading to increased cost for the lasers fabricated from such material. The regrowth step is avoided by using a thin p-clad design as discussed above. In these thin p-clad lasers, the lasing mode interacts with the surface of the laser, allowing one to tailor the characteristics of the lasing mode (and, hence, the laser beam) with surface processing.

It has been demonstrated previously that diffraction gratings fabricated in the surface of thin p-clad lasers can force the laser to operate at a single frequency with high output power. It has been difficult, however, to make such lasers produce a spatially coherent beam, limiting their utility to "low brightness" applications.

In controlling the lateral beam characteristics of semiconductor lasers, it is desirable to utilize a design which allows the fabrication of refractive index variations in the material in a region close to the quantum well (QW) active region, in a precise reproducible way. In principle, this can be achieved by etching precise structural variations into thin p-clad laser material since regrowth over the structural variations is not required [Macomber et al, *Proc. SPIE*, Vol. 3001, pages 42–54 (February 1997)]. In this case, it is important that the reflectivity of the metal contact-semiconductor interface be high at the lasing wavelength if low threshold current density operation is to be achieved [Wu et al, *IEEE Photonics Tech. Lett.*, Vol. 6, pages 1427–1429 (December 1994)]. This article is hereby expressly incorporated by reference in this application.

The first work on diode lasers using a thin p-clad design was conducted over 20 years ago [Zory et al, *IEEE J. Quantum Electron.*, Vol. QE-11, "Grating-coupled double-heterostructure AlGaAs diode lasers," pages 451–457 (1975); and Walpole et al, *Appl. Phys. Lett.*, Vol. 30, "CW operation of distributed feedback $Pb_{1-x}Sn_xTe$ lasers," pages 524–526 (1977)]. The work on such lasers was motivated by the fact that corrugated diffraction gratings could be incorporated into the laser material without any material regrowth over the corrugated surface. The performance of such devices was limited because of the layer uniformity problem inherent in the liquid phase epitaxy process used in growing the laser material. With the development of the MOCVD and MBE crystal growth techniques in the 1980's, work on corrugated thin p-clad lasers was revived, with substantial improvements in performance being achieved compared to the earlier work [Macomber et al, *Appl. Phys. Lett.*, Vol. 51, "Surface emitting distributed feedback semiconductor lasers," pages 472–474 (1987); Shani et al, *IEEE J. Quantum Electron.*, Vol. QE-24, "Metal clad $Pb_{1-x}Sn_xSe/Pb_{1-x-y}Eu_ySn_xSe$ distributed feedback lasers," pages 2135–2137 (1988); Rast et al, *IEEE Photonics Tech. Lett.*, Vol. 7, "Gain-coupled strained layer MQW-DFB lasers with an essentially simplified fabrication process for=1.55 $\mu m$," pages 830–832 (1995); and Smith et al, Proceedings of IEEE/LEOS Annual Meeting, San Francisco, Calif., "Wavelength tunable asymmetric cladding ridge waveguide distributed bragg reflector lasers," pages 294–295, (1995)]. Recent work [Macomber et al, *Proc. SPIE*, supra] indicates that surface emitting 2D laser arrays based on the corrugated thin p-clad laser concept are improving rapidly and show great promise for use in both commercial and defense-related applications.

It is an important object of the present invention to provide a semiconductor laser structure that is relatively simply to fabricate and which operates as a high power, high brightness, coherent semiconductor laser.

SUMMARY OF THE INVENTION

The present invention relates to a thin p-clad laser design and construction which, by virtue of the construction itself, results in the operation of the laser in a single spatial mode and/or spectral mode at high power levels. Since the processing required to implement this design is relatively simple, wafer processing costs are low, leading to low laser costs. Application areas for high brightness diode lasers include sensing, printing, communications and defense.

The invention is predicated on the discovery that a semiconductor laser, such as an InGaAs single quantum well, thin p-clad device, can be constructed such that the construction itself will yield a semiconductor laser in which, due to a resonant mode switching phenomenon, the peak of the transverse electric field intensity distribution of the laser mode switches from the quantum well active region to the cap layer. The resonant mode switching effect causes very large changes in the complex modal refractive index of the material, which is the key parameter that determines performance in semiconductor lasers. The semiconductor laser structure of the present invention will yield high power, coherent semiconductor lasers, and laser arrays having improved beam quality can thus be constructed.

As used herein, a "predetermined lasing wavelength" refers to the wavelength, in air, of the light to be employed in operating the laser device, while the "lasing wavelength in the material" will be used to refer to the wavelength of the "predetermined lasing wavelength" as it travels through the material making up the laser structure.

In particular, the semiconductor laser structure for lasing at a predetermined lasing wavelength, in accordance with the present invention comprises:

a top surface region;

a laser substructure disposed below the top surface region, the laser substructure comprising a plurality of semiconductor layers so constructed and arranged to have an active region in close proximity to the top surface region, wherein the proximity of the active region to the top surface region is on the order of the lasing wavelength in the material, and wherein said top surface region is separated from said active region by a separation region, made up of one or more semiconductor layers, the separation region having a thickness on the order of the lasing wavelength in the material, and having an average refractive index lower than that of the top surface region and the quantum well region;

the top surface region having at least one contoured section comprising at least one ridge and at least one valley adjacent the at least one ridge, a height of the at least one ridge being a distance between an upper surface of the ridge and a lower surface of the top surface region, and the height of the at least one valley being a distance between an upper surface of the valley and the lower surface of the top surface region, wherein the height of the at least one ridge is greater than a certain value related to a predetermined lasing wavelength, and wherein the at least one valley has a metal coating which has a high reflectivity at the predetermined lasing wavelength.

The top surface region of the semiconductor laser structure of the present invention may further have a thickness greater than ¼ of the lasing wavelength in the material.

The semiconductor laser structure of the present invention may also include a metal coating disposed on the at least one ridge, wherein the ridge metal coating has a different, preferably lower reflectivity at the lasing wavelength than does the metal coating of the at least one valley.

The semiconductor laser structure of the present invention may alternatively have a patchy metal coating deposited on the at least one ridge, wherein the size of the individual metal patches is on the order of the lasing wavelength in the material.

The semiconductor laser structure of the present invention may also comprise an electrically insulating layer disposed on the upper surface of the ridge, and the ridge metal coating is disposed over the electrically insulating layer.

The semiconductor laser structure of the present invention may further include the feature that the upper surface of the at least one ridge be roughened to a sufficient degree to produce optical scattering loss at the lasing wavelength.

The semiconductor laser structure for use at a predetermined lasing wavelength in accordance with the present invention may alternatively comprise:

a pumped section and an unpumped section, the pumped section further comprising:

a top surface region;

a laser substructure including a plurality of semiconductor layers disposed below the top surface region;

said laser substructure being so constructed and arranged to have an active region in close proximity to said top surface region, and separated therefrom by a separation region, the separation region having a lower refractive index than the top surface region and the active region, the top surface region having at least one contoured section comprising at least one ridge and at least one valley adjacent said at least one ridge, a height of the at least one ridge being a distance between an upper surface of the ridge and a lower surface of the top surface region, and a height of the at least one valley being a distance between an upper surface of the valley and the lower surface of the top surface region;

wherein the height of the ridge is greater than a certain value related to the predetermined lasing wavelength in said material; and wherein the at least one valley has a first metal coating layer formed thereon, the first metal coating layer having a high reflectivity at the predetermined lasing wavelength in the material;

the unpumped section further comprising:

a top surface region contoured to have at least one ridge and at least one adjacent valley whose respective heights are substantially identical to a ridge height and a valley height of the at least one ridge and the at least one valley in the pumped section, and wherein the at least one valley and the at least one ridge in the unpumped section are coated with an electrically insulating material.

BRIEF DESCRIPTION OF THE DRAWINGS

These and other features of the present invention and the attendant advantages will be readily apparent to those having ordinary skill in the art and the invention will be more easily understood from the following detailed description of the preferred embodiments taken in conjunction with the accompanying drawings wherein like reference characters represent like parts throughout the several views.

FIGS. 14A,B are graphs depicting the near field intensity patterns for a device constructed in accordance with the present invention.

FIGS. 15A,B,C,D are plots displaying lateral far field patterns for devices constructed in accordance with the present invention.

DETAILED DESCRIPTION OF THE PREFERRED EMBODIMENTS

Figure 1A:
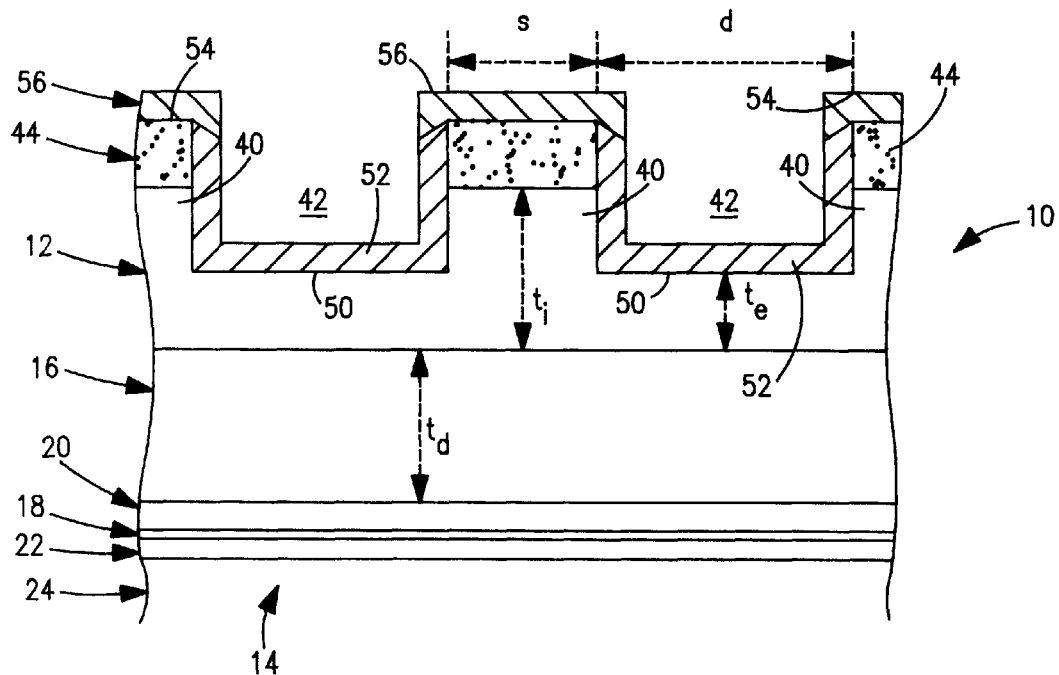
FIG. 1A is a substantially schematic cross-section view of modulated cap thin p-clad (MCTC) semiconductor laser structure in accordance with a preferred embodiment of the present invention.

Referring initially to FIG. 1A, a modulated cap thin p-clad (MCTC) semiconductor laser structure 10 according to a preferred embodiment of the present invention is illustrated in cross-section. The structure 10 in FIG. 1A includes a top surface layer 12, which may be referred to as a $p^+$-cap layer. This layer 12 may preferably be a GaAs layer.

The top surface layer 12 is deposited on a semiconductor laser substructure 14, which, in the illustrated preferred embodiment, is made up of a plurality of layers of semiconducting material. In this depicted embodiment, the substructure 14 has a thin p-clad layer 16 at its upper extent, which overlies a quantum well layer 18, having guide layers 20, 22 disposed above and below the quantum well layer 18, respectively. A n-clad layer 24 is disposed below the lower quantum well guide layer 22. This semiconductor laser substructure may itself be constructed on a substrate 26, as shown in FIG. 3.

Figure 3:
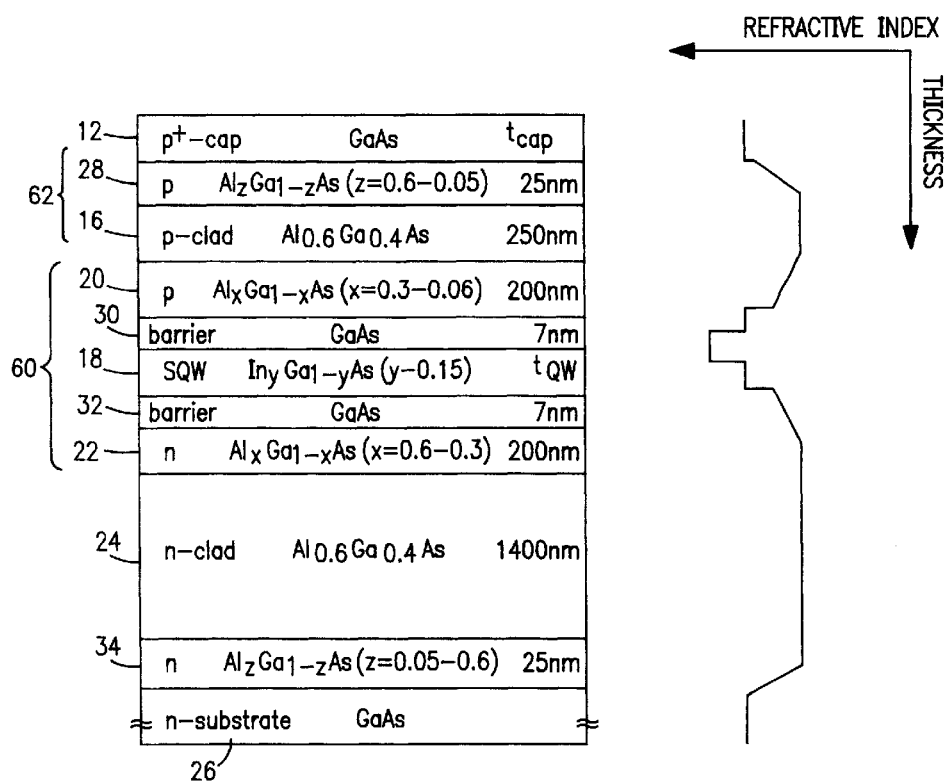
FIG. 3 is a substantially diagrammatic cross-section view of a specific thin p-clad InGaAs single quantum well laser structure in accordance with the present invention together with a plot showing the refractive index of each layer of the laser structure.

FIG. 3 presents a schematic cross-sectional view of a MCTC thin p-clad semiconductor laser 10' of the type shown in FIG. 1, but which includes graded barrier reduction layer 28 of p-type material disposed above p-clad layer 16, and a graded barrier reduction layer 34 of n-type material disposed on the underside of the n-clad layer 24. FIG. 3 also illustrates the use of barrier layers 30, 32 disposed on either side of quantum well layer 18.

Also shown in FIG. 3 is a graphical representation of the refractive index of each layer progressing through the thickness of the semiconductor laser structure 10'. This graphical representation is not to scale, because the structure itself on the left side of FIG. 3 does not show the layer thicknesses to scale.

In the structures in both FIG. 1 and FIG. 3, the p-clad layer may preferably be a layer of aluminum—gallium—arsenide, for example, of the composition $Al_{0.6}Ga_{0.4}As$, and may be of a thickness on the order of 250 nm. The single quantum well layer is preferably an indium—gallium—arsenide layer, for example, of the composition $In_{0.15}Ga_{0.85}As$, and of a thickness ($t_{Qw}$) on the order of 7 nm. The n-clad layer may preferably also be an aluminum—gallium—arsenide material, for example, of a composition $Al_{0.6}Ga_{0.4}As$, and of a thickness on the order of 1400 nm.

In the illustration of the structure 10' in FIG. 3, p-type graded barrier reduction layer 28 may preferably be of a composition $Al_zGa_{1-z}As$ ($0.6 \geq z \geq 0.05$) and of a thickness on the order of 25 nm. Barrier layers 30, 32 are preferably of made of GaAs. The preferred thickness of the barrier layers 30, 32 is on the order of 7 nm.

Guide layer 20 is preferably on the order of 200 nm thick and of a composition $Al_xGa_{1-x}As$, wherein $0.3 \geq x \geq 0.6$. Guide layer 22 is preferably on the order of 200 nm thick and of a composition $Al_xGa_{1-x}As$, wherein $0.6 \geq x \geq 0.3$. The n-type graded barrier reduction layer 34 is preferably on the order of 25 nm thick, with a composition $Al_zGa_{1-z}As$, wherein $0.05 \leq z \leq 0.6$.

The graphical representation of the refractive indices of each layer of the semiconductor laser structure illustrates an important feature of the present invention. It can be seen that the top surface layer or region 12 has a relatively high refractive index, as does the active region 60 in which quantum well layer 18 is disposed. Separating the top surface layer or region 12 from the active region 60 which includes, in FIG. 3, the quantum well material layer 18, barriers 30, 32, and guide layers 20, 22, is a separation region 62, which is essentially made up of p-clad layer 16 and the barrier reduction layer 28.

As can be deduced from the refractive index diagram portion of FIG. 3, and the layer thicknesses of the respective layers in FIG. 3, the average refractive index of the separation region 62 is lower than that of both the top surface region 12 and active region 60. The difference between the higher and lower refractive indices of these layers or regions may be as small as several percent, for example, five (5) percent, but this feature is essential to optimizing the performance of the laser structure.

Reverting back to FIG. 1, it may be seen that top surface layer or region 12 has a series of ridges 40 of a height or thickness $t_i$, corresponding to a distance between the upper surface of the ridge and the lower surface of the top surface layer. Disposed between ridges 40 are a plurality of valleys 42 having a height or thickness $t_e$, corresponding to the distance between the upper surface 50 of the valley and the lower surface of the top surface layer. The widths of the ridges 40 and valleys 42, respectively, are represented by the parameters s and d. In the illustrated embodiments, top surface region 12 is shown as being a single layer of a single material suggesting that the top surface region has a single uniform composition, although this is not an absolute requirement.

FIG. 1 also shows that, in one preferred embodiment of the present invention, the upper surface of each ridge 40 will have an electrically insulating layer 44, preferably an oxide layer, disposed thereon. The oxide layer may be present simply as an artifact of the manufacturing process, wherein non-pumped sections of the structure are produced by depositing the oxide layer on the structure. The oxide layer can have the benefit of confining the gain of the device to the valley regions, but this benefit can be obtained by techniques other than providing an oxide coating, if desired.

A further important aspect of this invention is that the semiconductor laser structure is constructed such that the exposed upper surface 50 of each valley has disposed thereon a layer 52 of a material, preferably a metal, which has a high reflectivity at a predetermined lasing wavelength. For example, if the semiconductor laser is designed to lase at a wavelength of 950 nm, suitable high reflectivity materials that can be coated onto the exposed surface 50 of the valleys 42 are gold (Au), platinum (Pt), and silver (Ag).

At the same time, the boundary of the upper surface 54 of the ridges 40 will preferably have a lower reflectivity than that provided by the coating layer 52 on the upper surface of the valleys 42. This can be achieved by coating the upper surfaces 54 of the ridges as well as the rest of the top surface of the laser structure (see FIGS. 13A,b) with a metal coating 56 which usually has a lower reflectivity than the metal coating 52 deposited in the valleys. Suitable metals for the lower reflectivity coating layer may be nickel, titanium, chromium, or any metal having good adhesion to all areas of the top surface of the structure.

Figure 8:
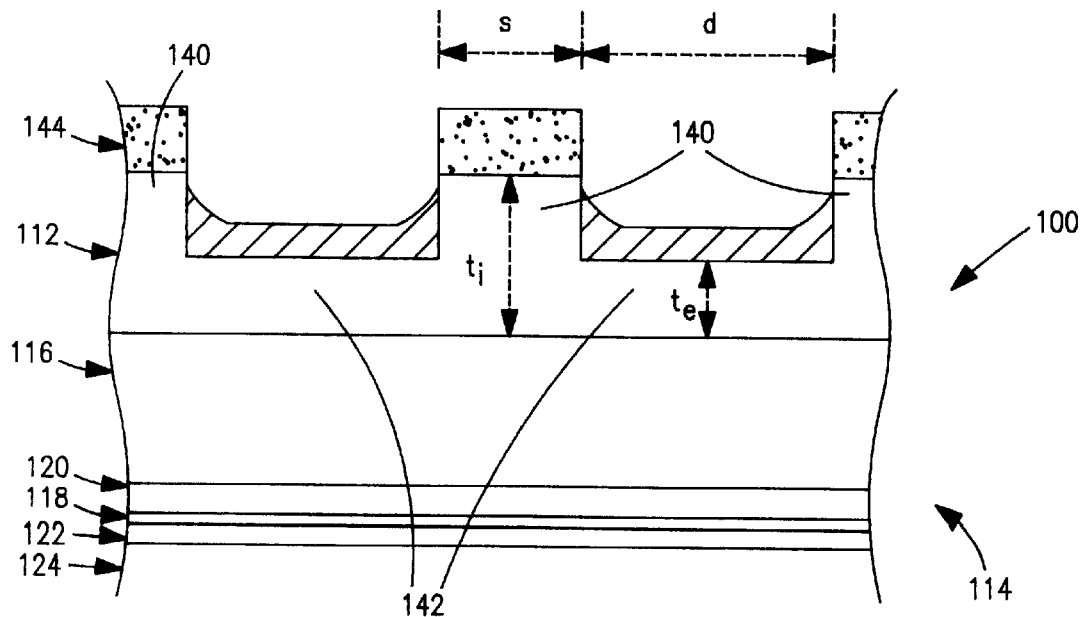
FIG. 8 is a substantially schematic cross-section view of a semiconductor laser structure according to an alternative preferred embodiment of the present invention.

Alternatively, the desired operation of the laser can be achieved by, in appropriate circumstances, covering the upper surface 54 of the ridge 40 with a suitable dielectric material, as seen in FIG. 8. That embodiment may be best suited when the device is intended to be used as a sensor.

By establishing a highly reflective surface at the upper boundary of the valley portions of the device, while having a surface of lower reflectivity at the upper portion of the ridges, it becomes possible to better control the laser beam. This may, however, come with the minor disadvantage that the laser operating current may be raised.

Alternative preferred semiconductor laser structures are depicted in FIGS. 8–13. FIG. 8 shows a semiconductor laser structure 100, which, like the structure shown in FIG. 1A, includes a top surface layer 112, a semiconductor laser substructure 114, a thin p-clad layer 116, a quantum well layer 118, guide layers 120, 122, an n-clad layer 124, ridges 140, valleys 142, and an electrically insulating oxide layer 144.

The alternative preferred embodiments shown in FIGS. 9–12 differ from those in FIGS. 1A and 8 in that the ridges in these structures do not have an electrically insulative layer disposed on their upper surfaces. In addition, each of these figures illustrates, by superimposed mode profile lines $M_{Qw}$ and $M_C$, the resonant mode switching phenomenon exhibited by these semiconductor layer structures wherein the peak P of the transverse electric field intensity distribution of the laser mode switches or moves from the quantum well active region to the top surface region or cap layer near the ridges.

Figure 9:
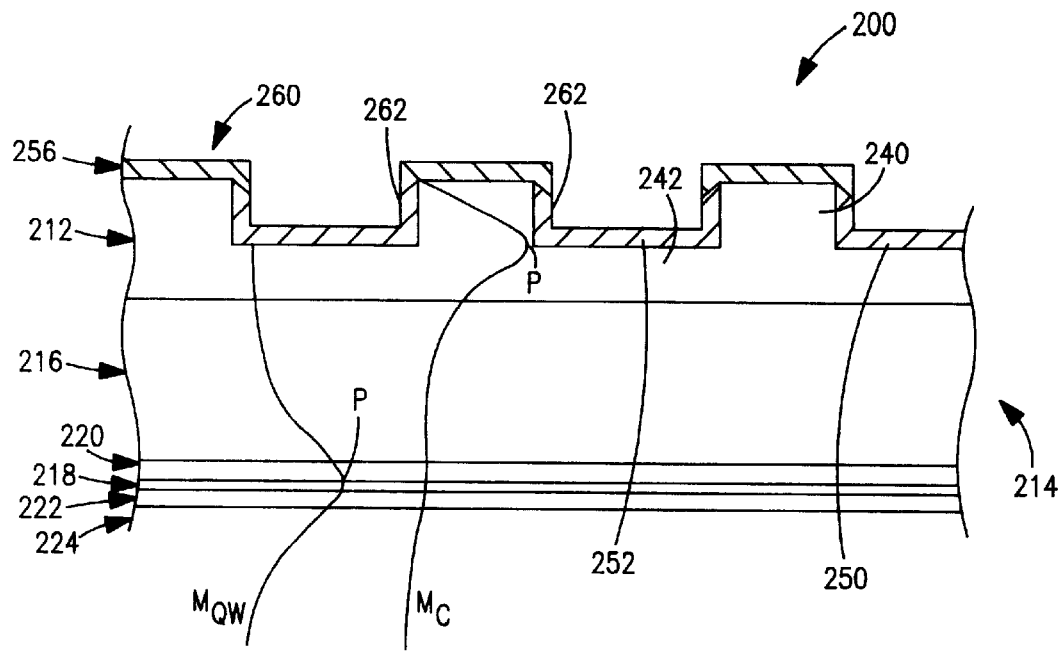
FIG. 9 is a substantially schematic cross-section view of a semiconductor laser structure according to an alternative preferred embodiment of the present invention.

FIG. 9 illustrates a semiconductor laser structure 200 having a top surface region or layer 212, and a semiconductor laser substructure 214, which includes a thin p-clad layer 216, a quantum well layer 218, guide layers 220, 222, and an n-clad layer 224. Ridges 240 and valleys 242 are also formed in or on the top surface layer 212. Thin p-clad layer 216 would also, in this embodiment, be the separation region between the top surface region or layer 212 and the active region, made up of quantum well layer 218, and guide layers 220, 222.

The FIG. 9 embodiment has a contiguous contact layer 260, made up of a first metal coating 252 formed on the exposed surfaces 250 of valleys 242, and a second metal coating 256 formed on the upper surface of ridges 240 as well as the rest of the top surface of the laser (not shown in FIG. 9). As in the FIG. 1A embodiment, the first metal coating 252 is made of a metal that will be highly reflective at the lasing wavelength to be employed, and the second metal coating 256 is made of a metal having a lower reflectivity than the first metal coating 252. As shown in FIG. 9, the first metal coating 252 extends across the upper surface 250 of the valleys 242, and up along the side walls 262 of ridges 240. The second metal coating 256 is disposed substantially only across the upper surface of the ridges 240. These metals may be deposited, and selectively removed, if desired, by known deposition and metal removal techniques.

Figure 10:
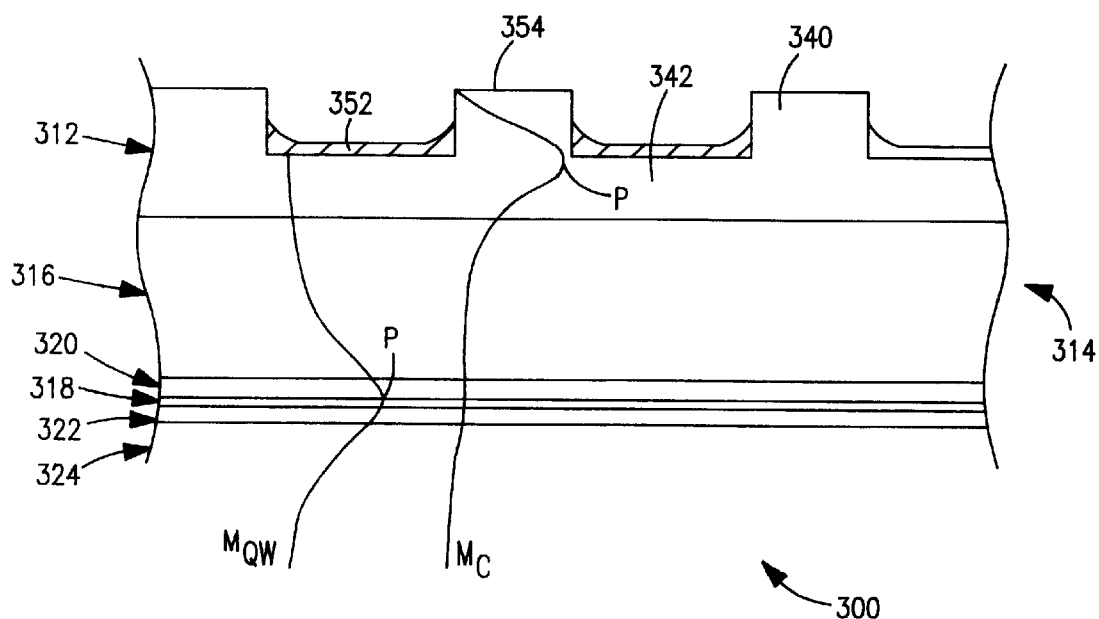
FIG. 10 is a substantially schematic cross-section view of a semiconductor laser structure according to an alternative preferred embodiment of the present invention.

FIG. 10 illustrates a semiconductor laser structure 300 having a top surface layer or region 312 on which ridges 340 and valleys 342 are formed. This embodiment also has the semiconductor laser substructure 314 which includes thin p-clad layer (separation region) 316, an active region made up of quantum well layer 318 and guide layers 320, 322; and the substructure further includes n-clad layer 324.

In this figure, the upper surfaces 354 of the ridges 340 remain exposed, and the valleys 242 are provided with a metal coating 352 which is formed of a metal that will be highly reflective at the lasing wavelength at which the laser will be operated. Again, this construction may preferably be employed when the device is intended to be used as a sensor.

Figure 11:
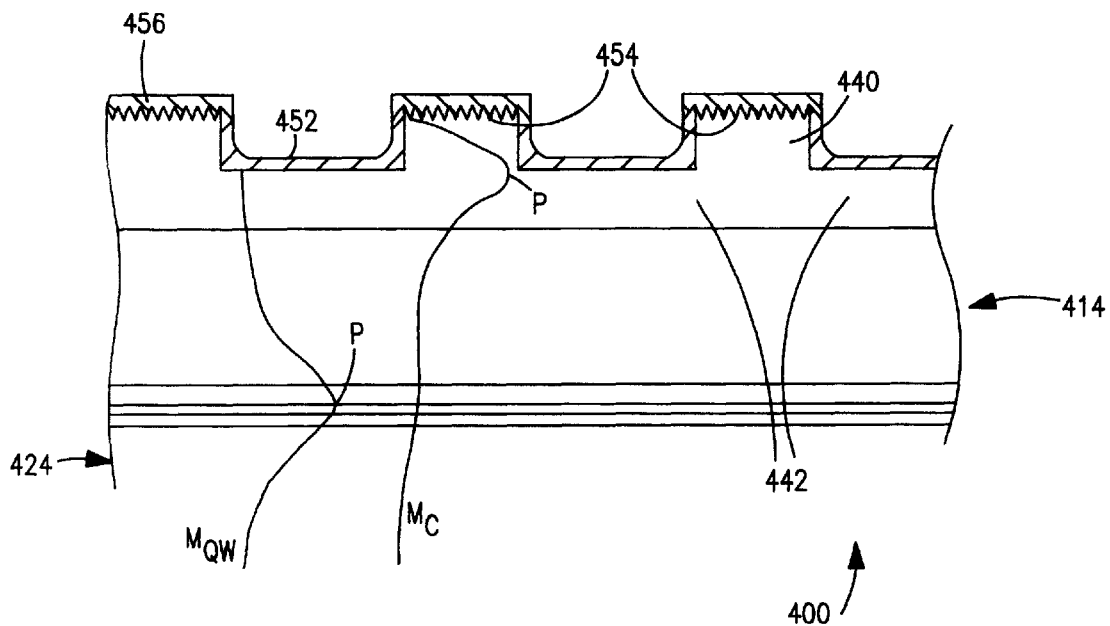
FIG. 11 is a substantially schematic cross-section view of a semiconductor laser structure according to an alternative preferred embodiment of the present invention.
Figure 12:
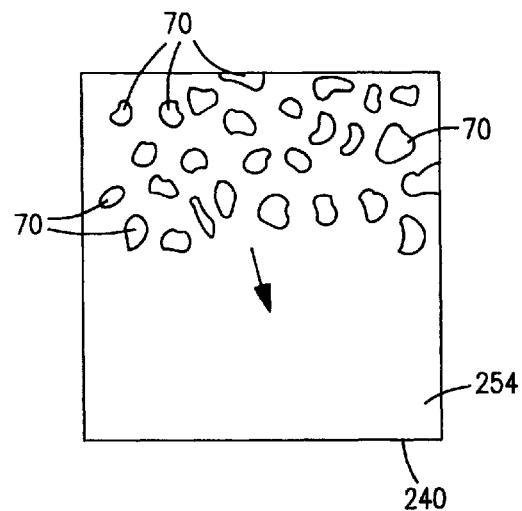
FIG. 12 is a top plan view of an upper surface of a ridge having a patchy metal coating deposited thereon.

In the FIG. 11 embodiment, the semiconductor laser structure 400 is, in most ways, identical to that of FIG. 10. FIG. 11 further illustrates that the upper surfaces 454 of ridges 440 may preferably be roughened in order to produce optical scattering loss at the lasing wavelength. The portion of the metal coating layer 456 shown as being disposed on the upper surface of the ridges may or may not be included This is a further structural variation that may be employed in order to achieve better beam control in the device. A typical desired degree of roughness that would be introduced would be where the resulting surface would have an root-mean-square (RMS) value on the order of the predetermined lasing wavelength in the material.

Instead of roughening the surface of the ridges to produce scattering loss, the surface of the ridges may be treated in different ways in order to produce a lossy surface. A preferred alternative to roughening the ridge material is illustrated schematically in FIG. 12. In this embodiment, either an ordered pattern or an essentially random dispersion of thin metal patches 70 is deposited across the entire upper surface 254 (only shown in part in FIG. 12) of the ridge 240. Particularly when the nominal size of (diameter or equivalent dimension) of the individual metal patches is on the order of the predetermined lasing wavelength in the material, the optical scattering loss at this surface is remarkable.

Figure 13A:
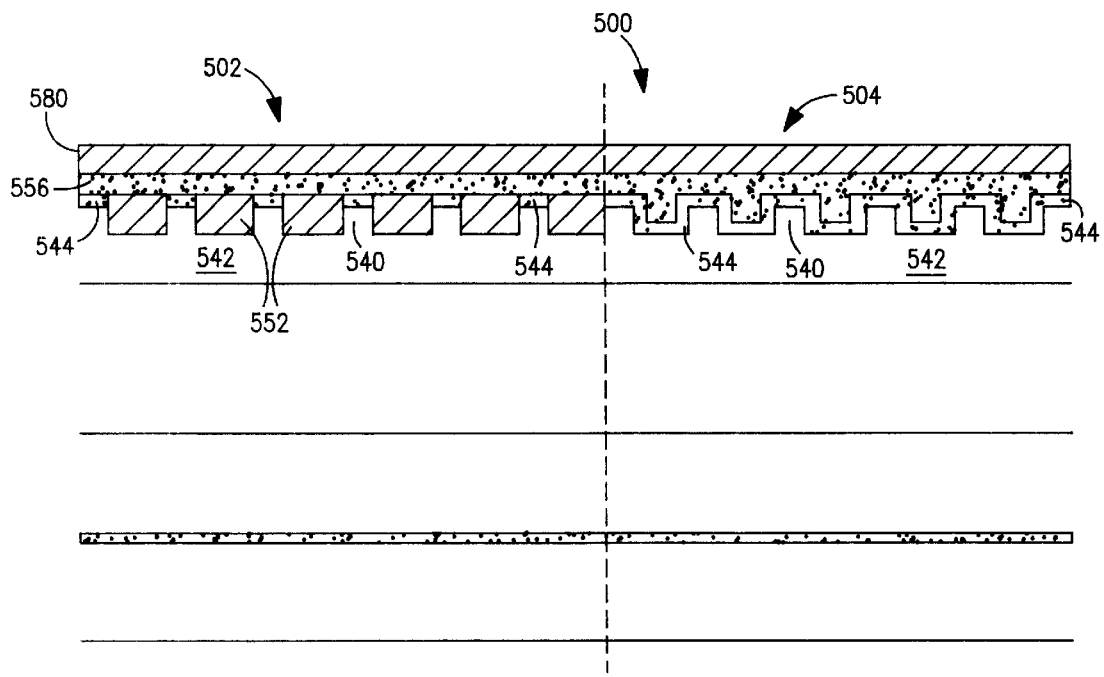
FIGS. 13A,B are substantially schematic cross-section views of alternative preferred embodiments of the semiconductor laser structure, which illustrate a pumped region and a unpumped region.

FIGS. 13A,B show semiconductor laser structures 500 having, as is typical of such a structure, a top surface having a section that is pumped (an area through which current flows), referred to herein as a pumped section 502, and one or more sections that are not pumped, referred to herein as umpumped section(s) 504. Because the contouring of the top surface region of the semiconductor laser structure involves additional manufacturing steps, the unpumped sections 504 are generally left as uniform layers as originally deposited.

There exist known processes for producing, on a semiconductor laser structure, unpumped sections. This can be achieved by covering the entire region with an electrically insulating film such as an oxide film 544. Alternatively, other methods and means for reducing the electrical conductivity may be employed at the regions which the device designer wishes to be unpumped regions on the device. Any of these methods will stop current from flowing, thus yielding an unpumped section.

It has been recognized, in the development of the present invention, that laser performance can be enhanced, and the desired operation of the laser can be better achieved, by producing the device to have substantially the same contouring of the top surface layer in the unpumped sections 504 of the device as is used for the pumped section 502, as shown in FIGS. 13A,B. It was determined in connection with the development of the device that the nature of the boundaries and the geometry of the contoured surface in the unpumped sections are important in obtaining the desired operation of the laser. Further, replicating the geometry of the pumped section in the unpumped section, by including the ridge 540 and valley 542 formation in the depicted embodiments is believed to provide the optimal laser performance.

Figure 13B:
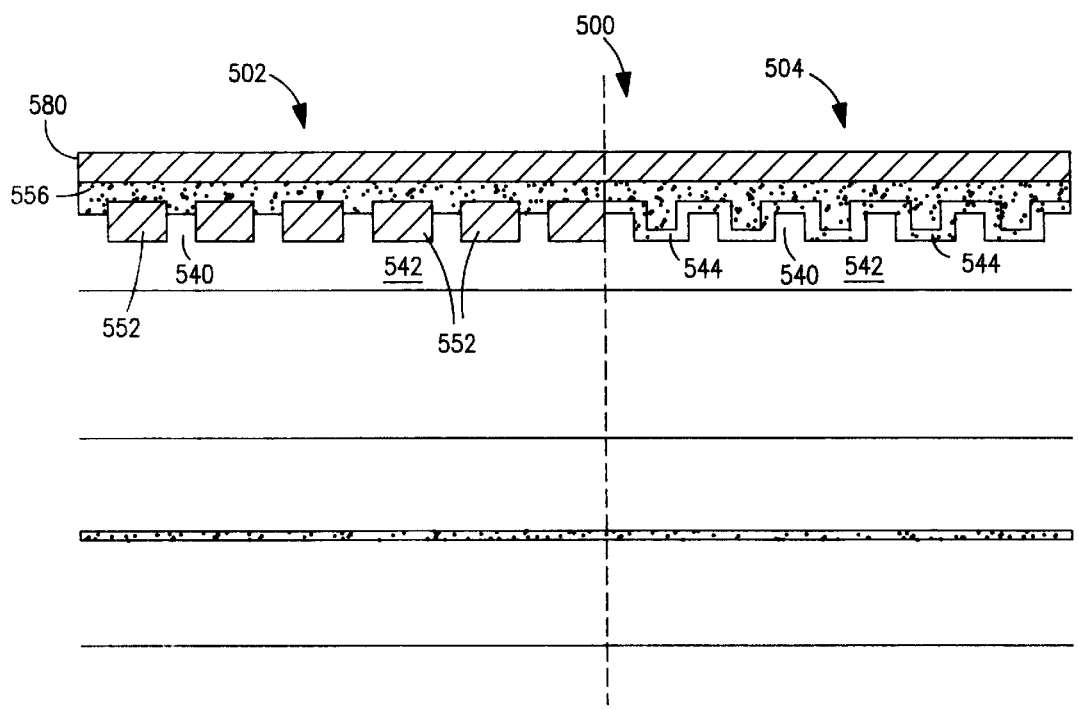

FIG. 13A depicts an embodiment in which the oxide material 544 deposited, in part, to create the umpumped section 504, has been left on the top surfaces of ridges 540. In contrast, FIG. 13B depicts an embodiment in which the oxide 544 deposited to create the unpumped section 504 has been removed from the top surfaces of the ridges 540. It can be seen in both of these figures that a metal layer coating 552 (represented schematically) of a highly reflective metal is deposited over the valley regions, and a metal layer coating of the different, preferably less reflective metal 556 is deposited across the tops of the ridges as well as over the highly reflective metal. A further layer 580 of, for example, a highly reflective material such as Ag, may be deposited over the low reflectivity metal to complete the overall contact layer structure.

Figure 1B:
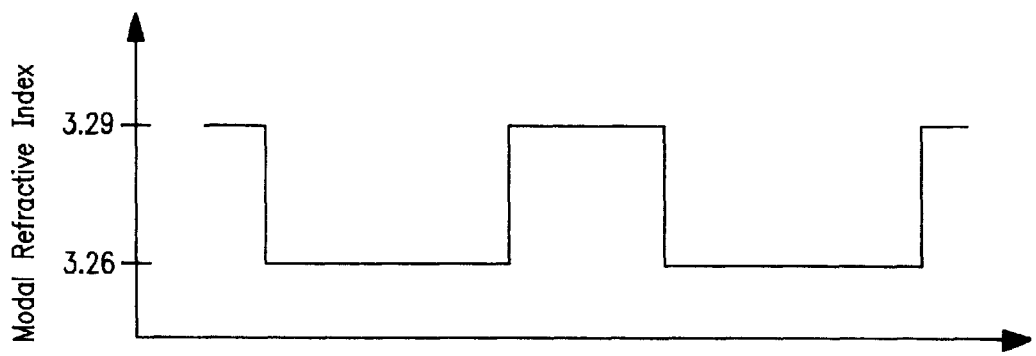
FIG. 1B depicts the $TE_0$ modal refractive index profile wherein $t_n$=100 nm and $t_k$=200 nm, in a semiconductor laser structure as shown in FIG. 1A.

The lateral refractive index variation for a fundamental transverse electric ($TE_0$) mode, to a first approximation, is given by the difference in effective refractive index $\Delta n_0$ between the $TE_0$ mode in each section of the structure. As shown in FIG. 1B, $\Delta n_0$ for the FIG. 1A structure ($t_n$=100 nm and $t_k$=200 nm) is 0.03, a quite large value considering that the difference in cap thickness between sections is only 100 nm. The reason for this large change can be traced to the fact that the peak of the $TE_0$ field distribution switches from the quantum well (QW) region of the waveguide to the cap region of the waveguide when the cap thickness expands from 100 nm to 200 nm [Miester et al, *Proc. SPIE,* Vol. 3001, pages 177–183 (February 1997)].

The use of the parameter $\Delta n_0$ to design lasers with this structure is, at best, very approximate since, for example, there are actually two transverse modes, $TE_0$ and $TE_1$, in the thick cap section of the structure. While sophisticated treatments for this type of problem exist [Amann, *IEEE J. Quantum Electron.,* Vol. QE-22, pages 1992–1998 (October 1986)], they are difficult to relate to this particular structure. Consequently, it was decided to study the relationship between device performance and the structural parameters: $t_n$, $t_k$, $w_n$ and $w_k$ defined in FIG. 1A. The device chosen for this study is the anti-guide array laser [Botez et al, *Appl. Phys. Lett.,* Vol. 53, pages 464–466 (August 1988); and Botez et al, *IEEE J. Quantum Electron.,* Vol. 26, pages 482–495 (March 1990)].

The diode structure shown in FIG. 1A is that of an anti-guide laser array since the thin cap, low index regions are pumped and the thick cap, high index regions are not pumped. With proper design, such devices can be made to lase such that all elements in the array are in-phase and the central lobe in the lateral far field has an angular width characteristic of the spatial width of the array. Using a 5-element design with $t_n$=100 nm, $t_k$=190 nm, $w_n$=6 μm and $w_k$=3.5 μm, in-phase lasing of the type described by Botez et al [*Appl. Phys. Lett.,* supra] has been achieved.

Figures 2A, 2B:
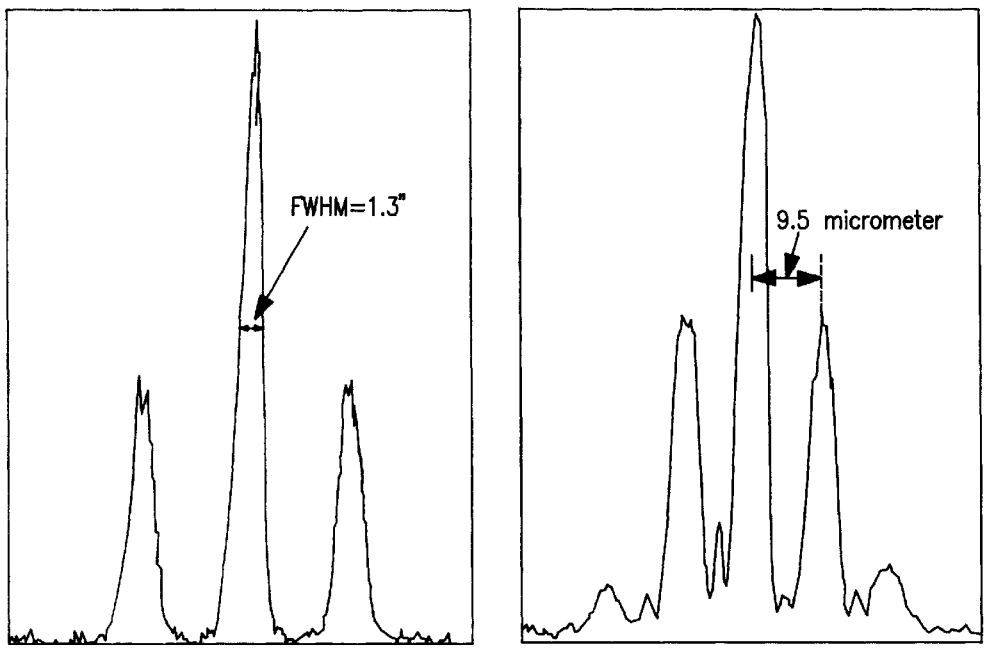
FIG. 2A is a plot which shows the lateral far field for a 5 period, 6 $\mu$m core, 3.5 $\mu$m inter-element, in-phase MCTC anti-guide array laser of the type illustrated in FIG. 1A.
FIG. 2B is a plot which indicates the lateral near field for the laser with the far field profile shown in FIG. 2A.

As shown in FIG. 2A, the full-width, half-maximum (FWHM) of the central lobe in the far field is 1.3°, consistent with what would be expected from a uniform phase laser beam with a width=5×9.5 μm=47.5 μm. The corresponding near field of the array is shown in FIG. 2B. The performance characteristics of this type of device as a function of drive current and other devices with different structural variations are described below.

As noted previously, the present invention is predicated on the discovery that a resonant mode switching phenomenon which occurs in InGaAs single quantum well, thin p-clad laser structures can be utilized to fabricate high power, coherent semiconductor lasers and laser arrays with improved beam and spectral quality. In this modulated cap thin p-clad (MCTC) design, the transverse electric field intensity distribution of the laser mode can be essentially switched from the quantum well active region to the cap layer by making cap layer thickness changes of 50 nm. This switching effect causes very large changes in the complex modal refractive index of the material, the key parameter that determines performance in semiconductor lasers. Since small cap layer thickness changes can be made precisely using simple, post-growth processing steps, complex laser structures can easily be fine-tuned to achieve optimal performance. Thus, the MCTC design can be used in a commercial scale manufacturing environment, to fabricate improved laser devices that will produce high power, coherent output.

The present invention enables (1) various contact schemes and laser structures to be studied using the unique laser turn-on delay phenomenon found in the MCTC structure; (2) the fabrication of antiguided array lasers which can be used to quantify the ability to control the predicted changes in complex modal refractive index and to obtain low lateral divergence output beams; (3) the fabrication of edge-emitting, angled grating distributed feedback lasers; and (4) the fabrication of grating-coupled, surface emitting lasers using the MCTC design with improved beam quality.

In standard epitaxial laser structures, the optical mode has little to no interaction with the surface of the wafer. Consequently, it is difficult to impact the modal gain loss and refractive index (complex modal index) without complicated processing and/or regrowth techniques. Using the MCTC structure, however, minor perturbations of the wafer surface produce significant changes in the complex modal index of the material. For example, using thin p-clad InGaAs single QW laser material incorporating a GaAs $p^+$-cap layer, small changes in cap layer thickness produce large variations in net modal gain. In experiments, lasers with a cap thickness of 100 nm lased with state-of-the-art threshold current densities ($J_{th}$) of 200 A/cm$^2$, whereas lasers with cap thicknesses of 200 nm lased at $J_{th}$ values of thousands of A/cm$^2$ with microsecond-long delays. The basic reason for this unusual behavior is due to the fact that the "switched" lasing mode in the 200 nm cap lasers has a much higher mode loss and much lower mode overlap with the QW than the standard mode in the 100 nm cap lasers. It is believed that the main cause for these delays is related to the fact that the heat generated in the contact resistance causes the refractive index in this region to increase as current on-time increases. This causes the net mode gain to increase with time until lasing occurs. Since the interface between the metal contact and the cap layer is also a source of heat only 50 nm away from the QW active region, it may also influence the delay time. Consequently, it is believed that this time-delay phenomenon will allow the obtention of quantitative information about the current-induced refractive index changes occurring in both the QW active and contact regions. Such knowledge will be useful in evaluating different contact schemes and in predicting the limitations of various semiconductor laser devices in which phase shifts due to heating effects are important.

In addition, the fabrication of laser test structures employing periodic variations in cap thickness will enable the measurement of the relationship between the cap thickness and the complex modal index. Data from these test structures are used to anchor the computer models.

The MCTC design principle may be used to fabricate edge-emitting, angled grating distributed feedback (DFB) lasers. The MCTC design feature that allows the "fine-tuning" of the complex mode index in as-grown laser material is useful in the fabrication of angled grating DFB lasers where the grating strength must be balanced with device length and width. Since periodic MCTC structures are naturally "antiphase" (sections with high modal refractive index have low modal gain and vice versa), grating-coupled surface emitting (GSE)-DFB lasers fabricated using the MCTC design can produce single-lobed output beams. This will have an important impact on thin p-clad GSE-DFB lasers where chirped gratings are conventionally used to obtain single-lobed output beams.

FIG. 3 is a diagram of the InGaAs single QW material used in accordance with the present invention.

In studying the effects of different contact metallurgies on material where the QW thickness ($T_{Qw}$) was 10 nm and the GaAs cap thickness ($t_{cap}$) was 100 nm, it was found that the lasing wavelength could be decreased by about 50 nm simply by changing the contact metallurgy from gold to nickel. See Wu et al, *Photonics Tech. Lett.*, Vol. 6, "Contact Reflectivity Effects on Thin p-Clad InGaAs Single Quantum Well Lasers," pages 1427–1429 (1994).

Using material with $t_{cap}$=200 nm and $T_{Qw}$=8 nm, high performance, single spatial mode ridge-guide lasers were fabricated using a very simple processing sequence. Comparisons with different stripe width lasers fabricated from thick p-clad material were also made and shown to have interesting differences in their performance characteristics. See Wu et al, *Photonics Tech. Lett.*, Vol. 7, "Characterization of Thin p-Clad InGaAs Single Quantum Well Lasers," pages 718–720 (1995).

Figure 4A:
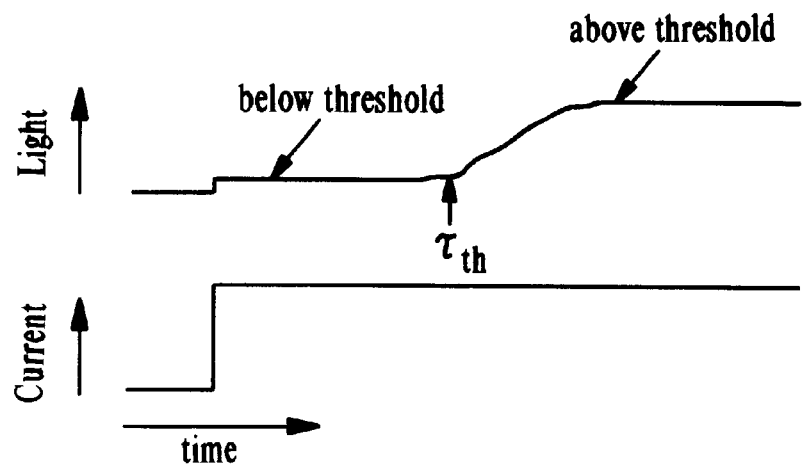
FIG. 4A illustrates a typical scope trace indicative of the delayed lasing phenomenon.
Figure 4B:
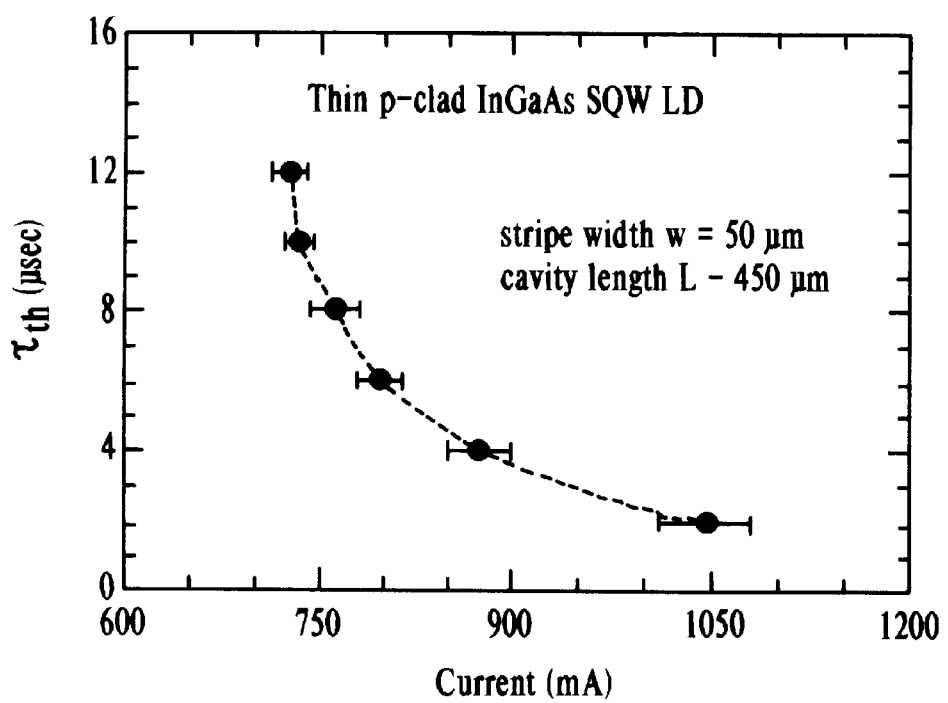
FIG. 4B is a plot of the lasing delay time versus drive current for lasers with cavity lengths of 450 $\mu$m and 50 $\mu$m stripe widths.

Using material with $t_{cap}$=200 nm and $T_{Qw}$=8 nm, a whole new regime of laser operation involving microsecond-long lasing turn-on delays was enabled. FIG. 4(a) is a sketch of a typical scope trace showing the delayed lasing and FIG. 4(b) is a plot of the lasing delay time versus drive current for lasers with cavity lengths of 450 μm and 50 μm stripe widths.

In order to avoid the lasing delay, a drive current approaching 2 A, corresponding to a threshold current density ($J_{th}$) of about 9,000 A/cm$^2$, is required. In contrast, $J_{th}$ for 50 μm stripe width lasers fabricated from the same material with $t_{cap}$=100 nm is about 250 A/cm$^2$. The reason for this drastic change in performance with 100 nm change in cap thickness can be traced to the changes in mode loss ($\alpha_i$) and mode overlap ($\Gamma$) with the QW active layer depicted in FIG. 5.

Figure 5:
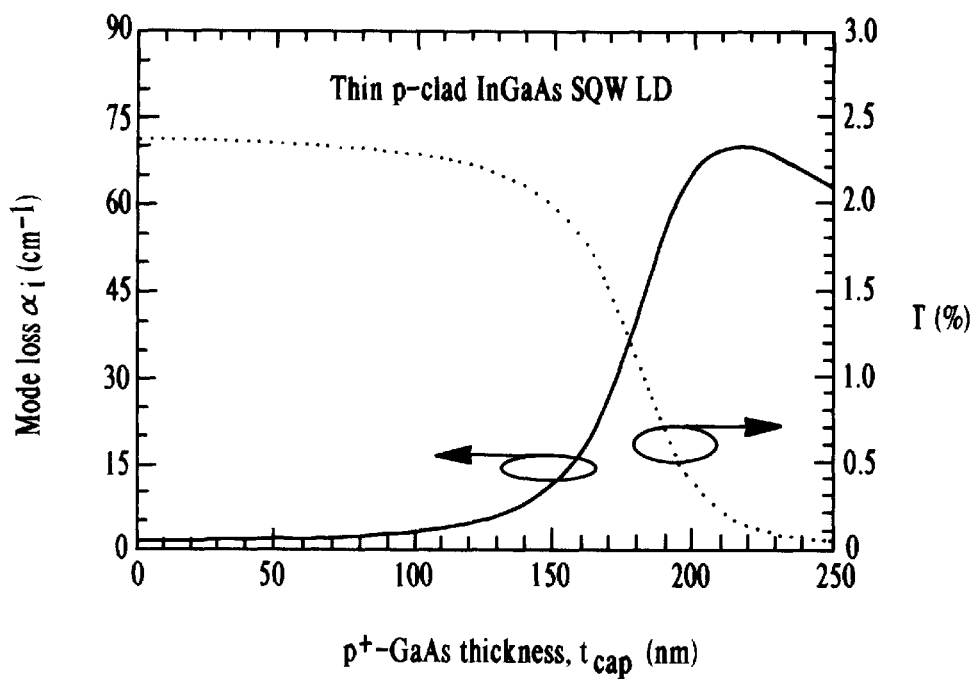
FIG. 5 is a diagram depicting mode loss and quantum well overlap as a function of $t_{cap}$.

As shown in FIG. 5, when the cap thickness starts to increase above 150 nm, $\alpha_i$ also starts to increase rapidly and $\Gamma$ starts to decrease rapidly. For $t_{cap}$=210 nm, $\alpha_i$ reaches a maximum value of 70 cm$^{-1}$ while $\Gamma$ continues to decrease. The reason for the sharp changes in $\alpha_i$ and $\Gamma$ in the vicinity of 200 nm cap thickness is related to the resonant mode-switching phenomenon depicted in FIG. 6 and achieved in the devices of the present invention.

When the cap thickness starts to increase above 150 nm, the peak of the transverse electric field intensity of the lasing mode in the QW region starts to shift rapidly to the cap layer. Since the mode switches from the QW region where the average refractive index is relatively low to the cap layer where the refractive index is relatively high, it might be expected that the change in modal refractive index ($n_m$) should be quite large. Using the $n_m$ values given in the parentheses next to each cap thickness in FIG. 6, the maximum change is 0.03. This value is indeed quite large and is an important feature in the design of laser structure utilizing alternating sections of thin and thick cap material.

Figure 6:
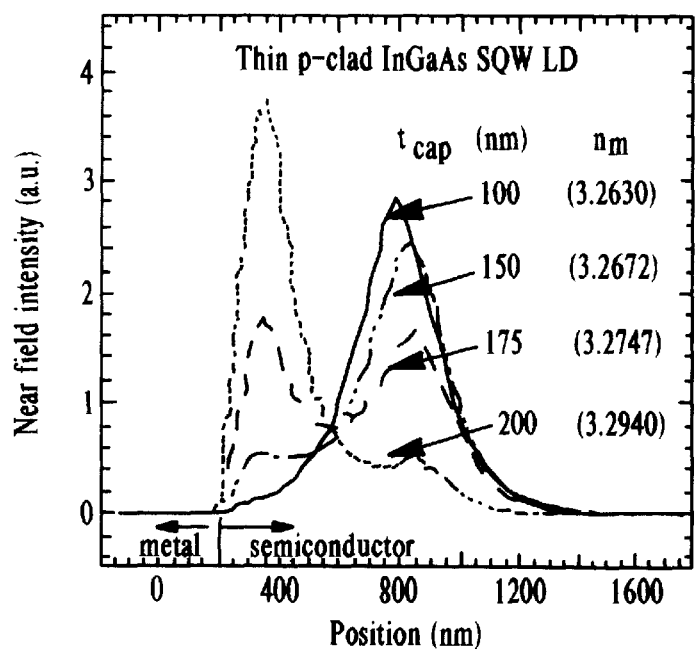
FIG. 6 depicts the transverse electric field intensity distributions and modal refractive indices for several values of $t_{cap}$ in laser structures according to the present invention.
Figure 7:
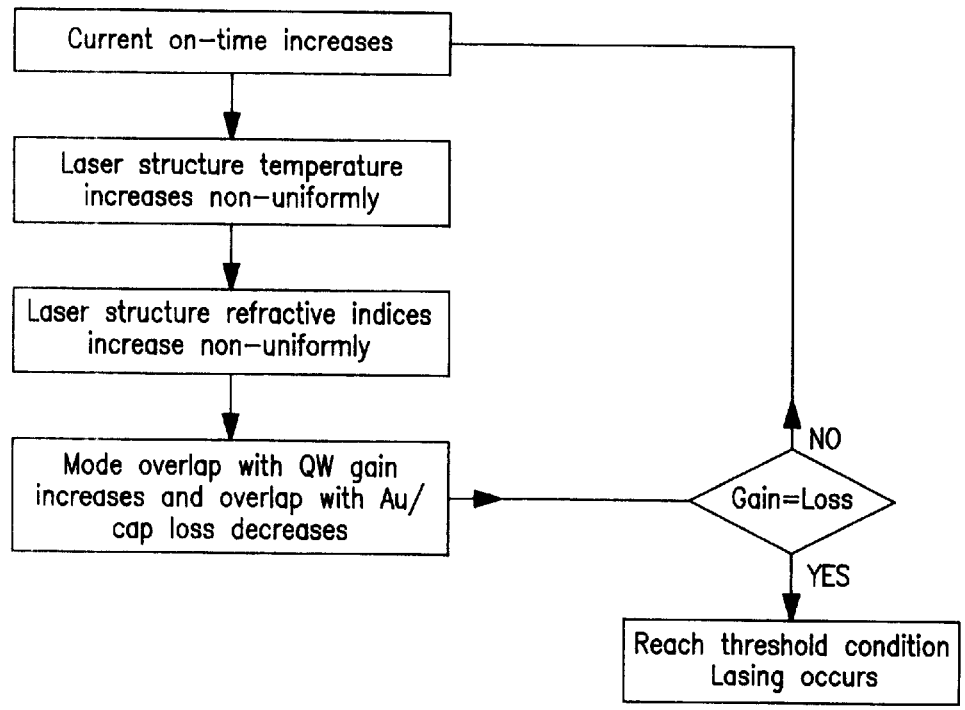
FIG. 7 is a flow diagram for the lasing turn-on delay mechanism.

With respect to the lasing turn-on delay phenomenon shown in FIG. 6, it is believed that its main cause is the heat generated in the contact resistance. This heating causes the refractive index in this region to increase with current on-time which, in turn, causes the lasing mode profile to change such that net mode gain increases. This process continues as current on-time increases until net mode gain= mode loss and lasing occurs. This sequence is depicted in the flow diagram shown in FIG. 7. Consequently, it is believed that this time-delay phenomenon may allow the obtention of quantitative information about the current-induced refractive index changes occurring in both the QW active region and contact region. Such knowledge should prove useful in evaluating different contact schemes and in predicting the limitations of various semiconductor laser devices in which the phase shifts due to heating are important.

The devices of the present invention can be fabricated using a photoresist mask and controlled anodization and strip steps [Grove et al, *J. Appl. Phys.*, Vol. 76, "Pulsed anodic oxides for III–V semiconductor device fabrication," pages 587–589 (1994)] to obtain the desired series of corrugated wafer sections. Standard wafer processing and packaging are then used to complete the laser arrays. Devices of the type described above are also fabricated from thin p-clad wafer material. Since it has been reported that lasers of this type are capable of generating diffraction limited beams with high power [Botez et al, *Appl. Phys. Lett.*, Vol. 58, "Watt-Range coherent uniphase powers from phase-locked arrays of antiguided diode lasers," pages 2070–2072 (1991)], it is expected that the MCTC designed anti-guide laser arrays will accomplish this. Since the mode loss in the high index regions of the MCTC arrays is not saturable, it is not expected that these arrays will self-pulsate.

EXAMPLE

An MCTC antiguided-array laser structure was fabricated having a structure shown in the cross-section of FIG. 1A. The p-clad layer is Al$_{0.6}$Ga$_{0.4}$As and two different p-clad thicknesses ($t_{ci}$); 250 and 460 nm were used in the experimentation. The cap layer for p-metal contact is highly p-doped GaAs and the structural variation is etched into the cap layer to induce the refractive index modulation shown in FIG. 1B. The symbols, $t_e$ and $t_i$, are designated for cap layer thicknesses in element region (valleys 42) and inter-element region (ridges 40) respectively, and for element and inter-element width dimensions, d and s are used respectively. The lateral refractive index variation shown in FIG. 1B is specified, to a first approximation, by the effective refractive index difference $\Delta n_0 = n_{0i} - n_{0e}$. In this equation, $n_{0i}$ and $n_{0e}$ are the effective refractive indices of the TE$_0$ mode in the inter-element and element regions respectively.

In order to have strong lateral coupling of the lasing elements, $n_{0i}$ and $n_{0e}$ should satisfy the following resonance condition;

$$n_{0i}^2 - n_{03}^2 = \frac{1}{4}\left[\left(\frac{m\lambda}{s}\right)^2 - \left(\frac{q\lambda}{d}\right)^2\right]. \quad (1)$$

In the above equation, m and q are the numbers of standing-wave peaks in the inter-element (ridges 140) and element (valleys 142) regions respectively, and λ is the laser emission wavelength. The number q should be 1 and m should be an odd number for the in-phase coupling, which is required for single main lobe far field patterns.

The cap thicknesses, $t_e$ and $t_i$ corresponding to $n_{Oe}$ and $n_{Oi}$ respectively, for the resonance condition, are determined from a calculated plot of effective-index versus cap-thickness for a given $t_{cl}$. For the typical thin p-clad laser structures of $t_{cl}$=250 and 460 nm, the effective index is almost constant when the cap thickness is less than 100 nm, and it increases monotonically as the cap thickness increases beyond 150 nm. Hence, we usually set $t_e \approx 100$ nm for which the corresponding effective index ($n_{Oe}$) is 3.263 and $n_{Oi}$ is determined from the equation (1) using predetermined values for m, $\lambda$, s and d. The inter-element cap thickness, $t_i$, corresponding to $n_{Oi}$ is then obtained from the plot of effective-index versus cap-thickness.

In addition to the resonance coupling condition, there is another aspect to be considered for optimum device operation. Making the inter-element loss (loss at ridges 40) high is one way to discriminate both adjacent and out-of-phase modes, thus allowing for sole in-phase mode operation. Thin p-clad structures also have a characteristic that makes it possible to make inter-element loss high. For the typical $T_{cl}$=250 nm structure with an Au p-metal contact, modal loss changes from a single digit number to more than 100 cm$^{-1}$ when cap thickness goes from 100 to 200 nm. Thus, the inter-element regions (ridges 40) have both bigger index and higher loss than the element regions (valleys 42).

The first step of the fabrication, after standard cleaning procedure with TCA, acetone, and methanol, is pulsed anodization to convert the top part of the cap layer into GaAs native oxide layer (~100 nm) and to make cap thickness $t_i$ at the same time, which means that the initial cap thickness should be bigger than $t_i$ at least by 100 nm. Photolithography is the next step to create the antiguided array patterns on the oxide layer where element regions are open stripes to be etched to obtain the cap thickness $t_e$ with a pulsed electro-chemical wet etching technique. The pulsed electrochemical wet etching technique used may preferably be the same as the pulsed anodization except with a different electrolyte, and the electrolyte consists of 8 parts ethylene glycol, 4 parts deionized water and 1 part 85% phosphoric acid ($H_3PO_4$). In order to control $t_i$ and $t_e$ precisely, the etch depths were experimentally formularized excluding oxide thickness for anodization and etching processes in terms of time with a certain set of the circuit parameter values for the anodization and etching set-up.

After etching the element regions and removing final oxide in the regions by letting the wafer sit in the etching electrolyte for a period of time after disconnecting the circuit, the element regions (valleys 42) were electroplated with a highly reflective metal coating layer, in this case, Au. Since the oxide layer on the inter-element region (ridges 40) still remains to confine gain to the element regions, the individual elements of the arrays must be connected to each other with an electrically conductive material. This can preferably involve the depositing of a metal coating layer of lower reflectivity, using electron beam evaporation, lift-off and electroplating processes. An electroplating process was also used for n-metallization (Au) after thinning the wafer. The etch depths of the samples used in this work were measured with an atomic force microscope (AFM).

MCTC antiguided-array lasers with 5 and 20 elements were fabricated. The five-element devices had d=6 $\mu$m and s=3.5 $\mu$m and the twenty-element devices had d=5 $\mu$m and s=2 $\mu$m. The p-clad thickness of the material used for the 5-element devices was 250 nm, while that for the 20 element devices was 465 nm. The devices were designed for m=3 in-phase mode operation with the laser emission wavelength of 950 nm. The calculated $\Delta n_0$ for the 5-element devices was 0.025 and that for the 20 element devices was 0.076. Twenty-element, m=2, out-of-phase mode devices with d=5 $\mu$m and s=2 $\mu$m were also fabricated. In this case, $\Delta n_0$ was 0.033. All the devices were cleaved into 500 $\mu$m cavity lengths and characterized.

The near field intensity patterns of a typical m=2 design, 20-element device at I=2I$_{th}$ and I=15I$_{th}$ are shown in FIGS. 14A and 14B. While the m=3 design, 20-element devices had similar near field patterns, the far field patterns for the two designs were quite different. The two upper lateral far field patterns of FIGS. 15A and 15B labeled "in-phase", were obtained from an m=3 designed device and the lower far field patterns labeled "out-of-phase" (FIGS. 15C, 15D) were obtained from an m=2 designed device. The full width at half maximum (FWHM) of the central lobe of the in-phase device is 0.8° at I=1.2I$_{th}$ (about two times the diffraction-limit) and that of the out-of-phase mode at I=2I$_{th}$ is about 1.0°. For the in-phase device, about 75% of the total output power resides in the central lobe. As current was increased, the basic phase-locked far field patterns of both devices were well maintained up to the 2 ampere current limit of the power supply employed, although additional side-lobes did appear. In addition, the widths of the main lobes increased to about four times the diffraction-limit (1.6°).

The five-element, m=3, designed devices described above operated typically with far field patterns similar to those shown in FIGS. 15A, B, for the 20-element in-phase device. The FWHM of the central lobe at I=1.2I$_{th}$ was typically about 1.3°, very close to the diffraction limit of 1.23°. In addition, about 55% of the power resided in the central lobe. The reason for reduced power in the central lobe compared to the 2b0-element device is believed to be due to the lower ratio of d to s in the five-element devices. As current was increased, the lobe widths broadened in a manner similar to that shown in FIGS. 15A,B, although additional sidelobes did not appear. The yield of five-element devices having the "typical" far field patterns described above was about 70% while that for the 20-element in-phase devices was about 5%.

The twenty-element, m=2, designed devices had a threshold current I$_{th}$ of about 140 mA with a total slope efficiency ($\eta$) of about 0.52 W/A. The measurements were made using 40 $\mu$sec wide current pulses at a frequency of 1 kHz. The twenty-element, m=3, designed devices had I$_{th}$ of about 200 mA and 77 of about 0.4 W/A (2 $\mu$sec pulse width and 1 kHz rep. rate). The five-element, m=3, designed devices had I$_{th}$ of about 80 mA and $\eta$ of about 0.43 W/A (80 $\mu$sec pulse width and 1 kHz rep. rate).

What is claimed is:

1. A semiconductor laser structure for use at a predetermined lasing wavelength comprising:

a top surface region;

a laser substructure including a plurality of semiconductor layers disposed below said top surface region;

said laser substructure being so constructed and arranged to have an active region in close proximity to said top surface region, and separated therefrom by a separation region, said separation region having a lower refractive index than said top surface region and said active region, said top surface region having at least one contoured section comprising at least one ridge and at least one valley adjacent said at least one ridge, a height of said at least one ridge being a distance between an upper surface of said ridge and a lower surface of said top surface region, and a height of said at least one valley being a distance between an upper surface of said valley and said lower surface of said top surface region;

wherein said height of said ridge is greater than a certain value related to said predetermined lasing wavelength in said material; and wherein said at least one valley has a first metal coating layer formed thereon, said first metal coating layer having a high reflectivity at said predetermined lasing wavelength in said material.

2. A semiconductor laser structure as recited in claim 1, wherein said separation region has a thickness on the order of the predetermined lasing wavelength in said material.

3. A semiconductor laser structure as recited in claim 1, further comprising a second metal coating layer formed above an upper surface of said at least one ridge, said second metal coating layer having a reflectivity which is different than a reflectivity of said first metal coating layer at said predetermined lasing wavelength.

4. A semiconductor laser structure as recited in claim 3, wherein said second metal coating layer has a reflectivity which is lower than a reflectivity of said first metal coating layer at said predetermined lasing wavelength.

5. A semiconductor laser structure as recited in claim 4 further comprising a layer of an electrically insulating material formed on said upper surface of said at least one ridge, and wherein said second metal coating layer is formed on an upper surface of said electrically insulating material layer.

6. A semiconductor laser structure as recited in claim 1 wherein said upper surface of said at least one ridge is treated in a manner to produce optical scattering loss at said upper surface when said laser structure is operated at said predetermined lasing wavelength.

7. A semiconductor laser structure as recited in claim 1 wherein said upper surface of said at least one ridge has a roughness sufficient to produce optical scattering loss at said upper surface when said laser structure is operated at said predetermined lasing wavelength.

8. A semiconductor laser structure as recited in claim 1 wherein said upper surface of said at least one ridge has a non-continuous, patchy metal coating comprising a plurality of metal patches deposited thereon to produce optical scattering loss at said upper surface when said laser structure is operated at said predetermined lasing wavelength.

9. A semiconductor laser structure as recited in claim 8 wherein said metal patches are of a nominal size on the order of the predetermined lasing wavelength in the material.

10. A semiconductor laser structure as recited in claim 6, further comprising a second metal coating layer formed on said rough upper surface of said at least one ridge, said second metal coating layer having a reflectivity lower than a reflectivity of said first metal coating layer at said predetermined lasing wavelength.

11. A semiconductor laser structure as recited in claim 1, wherein said top surface region comprises a single layer of material of a substantially uniform composition, said single layer having said at least one ridge and said at least one valley formed therein.

12. A semiconductor laser structure as recited in claim 1, further comprising a layer of an electrically insulating material formed on said upper surface of said at least one ridge.

13. A semiconductor laser structure as recited in claim 1, wherein the top surface region has a thickness greater than ¼ of the predetermined lasing wavelength in the material.

14. A semiconductor laser structure as recited in claim 1, wherein a height of said at least one ridge is greater than about 150 nm.

15. A semiconductor laser structure as recited in claim 1 wherein said top surface region comprises a contoured surface having a plurality of alternating ridges and valleys, each of said ridges being of substantially the same height as all other said ridges, and each of said valleys being of substantially the same height as all other said ridges, and wherein said first metal coating layer is formed on an upper surface of each of said plurality of valleys.

16. A semiconductor laser structure as recited in claim 15, further comprising a second metal coating layer formed above an upper surface of each of said plurality of ridges, said second metal coating layer having a reflectivity which is different than a reflectivity of said first metal coating layer at said predetermined lasing wavelength.

17. A semiconductor laser structure as recited in claim 16, wherein said second metal coating layer has a reflectivity which is lower than a reflectivity of said first metal coating layer at said predetermined lasing wavelength.

18. A semiconductor laser structure for use at a predetermined lasing wavelength comprising:

a pumped section and an unpumped section, said pumped section further comprising:

a top surface region;

a laser substructure including a plurality of semiconductor layers disposed below said top surface region;

said laser substructure being so constructed and arranged to have an active region in close proximity to said top surface region, and separated therefrom by a separation region, said separation region having a lower refractive index than said top surface region and said active region, said top surface region having at least one contoured section comprising at least one ridge and at least one valley adjacent said at least one ridge, a height of said at least one ridge being a distance between an upper surface of said ridge and a lower surface of said top surface region, and a height of said at least one valley being a distance between an upper surface of said valley and said lower surface of said top surface region;

wherein said height of said ridge is greater than a certain value related to said predetermined lasing wavelength in said material; and wherein said at least one valley has a first metal coating layer formed thereon, said first metal coating layer having a high reflectivity at said predetermined lasing wavelength in said material;

said unpumped section further comprising:

a top surface region contoured to have at least one ridge and at least one adjacent valley whose respective heights are substantially identical to a ridge height and a valley height of said at least one ridge and said at least one valley in said pumped section, and wherein said at least one valley and said at least one ridge in said unpumped section are coated with an electrically insulating material.

19. A semiconductor laser structure as recited in claim 1 wherein said top surface region of each of said pumped section and of said umpumped section comprises a contoured surface having a plurality of alternating ridges and valleys, each of said ridges being of substantially the same height as all other said ridges, and each of said valleys being of substantially the same height as all other said ridges, and wherein said first metal coating layer is formed on an upper surface of each of said plurality of valleys in said pumped section.

* * * * *